(12) United States Patent
Zhang et al.

(10) Patent No.: US 11,239,448 B2
(45) Date of Patent: Feb. 1, 2022

(54) ORGANIC LIGHT-EMITTING DISPLAY PANEL AND DISPLAY APPARATUS

(71) Applicant: Shanghai Tianma AM-OLED Co., Ltd., Shanghai (CN)

(72) Inventors: Guofeng Zhang, Wuhan (CN); Quanpeng Yu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/941,280

(22) Filed: Jul. 28, 2020

(65) Prior Publication Data
US 2021/0384473 A1    Dec. 9, 2021

(30) Foreign Application Priority Data
Jun. 4, 2020 (CN) .......................... 202010498769.6

(51) Int. Cl.
| | |
|---|---|
| *G06F 3/044* | (2006.01) |
| *H01L 51/52* | (2006.01) |
| *G06F 3/041* | (2006.01) |
| *H01L 27/32* | (2006.01) |

(52) U.S. Cl.
CPC ........ *H01L 51/5275* (2013.01); *G06F 3/0412* (2013.01); *H01L 27/323* (2013.01); *H01L 51/5253* (2013.01); *G06F 3/0443* (2019.05); *G06F 3/04164* (2019.05); *H01L 27/3244* (2013.01)

(58) Field of Classification Search
USPC ..................................... 257/40; 345/210–215
See application file for complete search history.

(56) References Cited

U.S. PATENT DOCUMENTS

| | | | | |
|---|---|---|---|---|
| 9,711,758 | B2* | 7/2017 | Mackerron | ......... H01L 51/5268 |
| 2008/0238310 | A1* | 10/2008 | Forrest | ................ H01L 51/5275 |
| | | | | 313/506 |
| 2008/0310186 | A1* | 12/2008 | Chari | ............... B29D 11/00365 |
| | | | | 362/608 |

(Continued)

FOREIGN PATENT DOCUMENTS

| | | |
|---|---|---|
| CN | 107579095 A | 1/2018 |
| CN | 110416435 A | 11/2019 |

*Primary Examiner* — Tony O Davis
(74) *Attorney, Agent, or Firm* — Christensen O'Connor Johnson Kindness PLLC

(57) ABSTRACT

Provided is an organic light-emitting display panel, including: a thin film transistor layer provided in a display area; an organic light-emitting layer provided in the display area and including light-emitting pixels; a microlens array layer provided in the display area and including microlenses corresponding to the light-emitting pixels; a refractive index matching layer provided in the display area; and a filling layer provided in the non-display area. The refractive index matching layer and the microlens array layer have different refractive indexes. Each microlens includes a first surface that is in contact with the refractive index matching layer. The first surface is a curved surface protruding towards one of the microlens array layer and the refractive index matching layer, which has a smaller refractive index. A material of the filling layer is same as at least one of materials of the microlens array layer and the refractive index matching layer.

20 Claims, 11 Drawing Sheets

(56) References Cited

U.S. PATENT DOCUMENTS

| | | | |
|---|---|---|---|
| 2010/0181899 A1* | 7/2010 | Forrest | H01L 51/5012 |
| | | | 313/504 |
| 2010/0201256 A1* | 8/2010 | Xue | H05B 33/22 |
| | | | 313/504 |
| 2011/0259407 A1* | 10/2011 | Kim | H02S 40/22 |
| | | | 136/255 |
| 2014/0361270 A1* | 12/2014 | Cui | H01L 51/5275 |
| | | | 257/40 |
| 2015/0144928 A1* | 5/2015 | Forrest | H01L 51/56 |
| | | | 257/40 |
| 2016/0028036 A1* | 1/2016 | Xue | H01L 51/5036 |
| | | | 257/40 |
| 2019/0181384 A1* | 6/2019 | Forrest | G02B 3/0056 |
| 2021/0184177 A1* | 6/2021 | Kristal | H01L 51/5275 |

* cited by examiner

ORGANIC LIGHT-EMITTING DISPLAY PANEL AND DISPLAY APPARATUS

CROSS-REFERENCE TO RELATED APPLICATIONS

The present application claims priority to Chinese Patent Application No. 202010498769.6, filed on Jun. 4, 2020, the content of which is incorporated herein by reference in its entirety.

TECHNICAL FIELD

The present disclosure relates to the field of display technologies, and more particularly, to an organic light-emitting display panel and a display apparatus.

BACKGROUND

Compared with a liquid crystal display screen, an organic light-emitting display screen has various advantages such as lightness and thinness, high brightness, low power consumption, fast response, high definition, good flexibility, high light-emitting efficiency, etc., and has gradually become a mainstream display technology. A principle of light emission of the organic light-emitting display screen lies in that holes generated by an anode in the organic light-emitting device and electrons generated by a cathode in the organic light-emitting device move under an action of an electric field to be injected into a hole transport layer and an electron transport layer, respectively, and then are migrated to an organic light-emitting material layer. The holes and the electrons meet each other in the light-emitting material layer to generate energy excitons, thereby exciting light-emitting molecules in the organic light-emitting material layer to generate visible light.

However, since the organic light-emitting devices are merely provided in a display area, and some other layers are also merely provided in the display area, there is a segment difference between the display area and a non-display area due to different layer arrangements. The segment difference between the display area and the non-display area may create a risk of cracking or film breakage during a manufacturing process of a layer structure crossing the display area and the non-display area. For example, during a manufacturing process of a signal line crossing the display area and the non-display area, a thickness of a photoresist of the non-display area is larger than a thickness of a photoresist of the display area. Then, during an exposure process, the photoresist of the non-display area may not be completely cured. As a result, the photoresist that needs to be cured but has not been cured is developed away during a development process, thereby resulting in that a portion of the signal line that needs to be remained is etched away during an etching process.

SUMMARY

In view of this, embodiments of the present disclosure provide an organic light-emitting display panel and a display apparatus, aiming to solve the above-described problems.

The embodiments of the present disclosure provide an organic light-emitting display panel having a display area and a non-display area surrounding the display area. The organic light-emitting display panel includes: a thin film transistor layer provided in the display area; an organic light-emitting layer provided in the display area and located at a side of the thin film transistor layer close to a light-exiting surface of the organic light-emitting display panel; a microlens array layer provided in the display area and located at a side of the organic light-emitting layer close to the light-exiting surface of the organic light-emitting display panel; a refractive index matching layer provided in the display area and located at a side of the microlens array layer close to the light-exiting surface of the organic light-emitting display panel; and at least one filling layer provided in the non-display area. The organic light-emitting layer includes a plurality of light-emitting pixels, the microlens array layer includes a plurality of microlenses corresponding to the plurality of light-emitting pixels; the refractive index matching layer and the microlens array layer have different refractive indexes, each of the plurality of microlenses includes a first surface that is in contact with the refractive index matching layer, and the first surface is a curved surface protruding towards one of the microlens array layer and the refractive index matching layer, which has a smaller refractive index. The thin film transistor layer includes a plurality of inorganic layers extending from the display area to the non-display area, and the at least one filling layer is arranged at a side of the plurality of inorganic layers close to the light-exiting surface of the organic light-emitting display panel. A material of each of the at least one filling layer is identical with (same as) at least one of a material of the microlens array layer and a material of the refractive index matching layer.

The embodiments of the present disclosure further provide an organic light-emitting display apparatus including the organic light-emitting display panel described in the first aspect.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, and other drawings can also be acquired by those skilled in the art without paying creative efforts.

DESCRIPTION OF EMBODIMENTS

In order to better understand technical solutions of the present disclosure, the embodiments of the present disclosure will be described in detail with reference to the drawings.

It should be clear that the described embodiments are merely part of the embodiments of the present disclosure rather than all the embodiments. All other embodiments obtained by those skilled in the art shall fall into the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that, the term "and/or" is used in the present disclosure merely to describe relations between associated objects, and thus includes three types of relations. That is, A and/or B can represent: (a) A exists alone; (b) A and B exist at the same time; or (c) B exists alone. In addition, the character "/" generally indicates "or".

In the description of this specification, it should be understood that the terms "substantially", "basically" "approximately", "about", "almost" and "roughly" described in the claims and embodiments of the present disclosure indicates a value that can be generally agreed within a reasonable process operation range or tolerance range, rather than an exact value.

It is to be noted that, while some structures may be described using terms such as "first", "second", etc., in the embodiments of the present disclosure, they are not limited to by these terms, which are used for distinguishing these structures from one another only. For example, a first filling layer may be referred to as a second filling layer, without departing from the scope of the embodiments of the present disclosure. Likewise, a second filling layer may be referred to as a first filling layer.

The inventors of the present disclosure have studied the problems with the related art to provide a solution.

Figure 1:
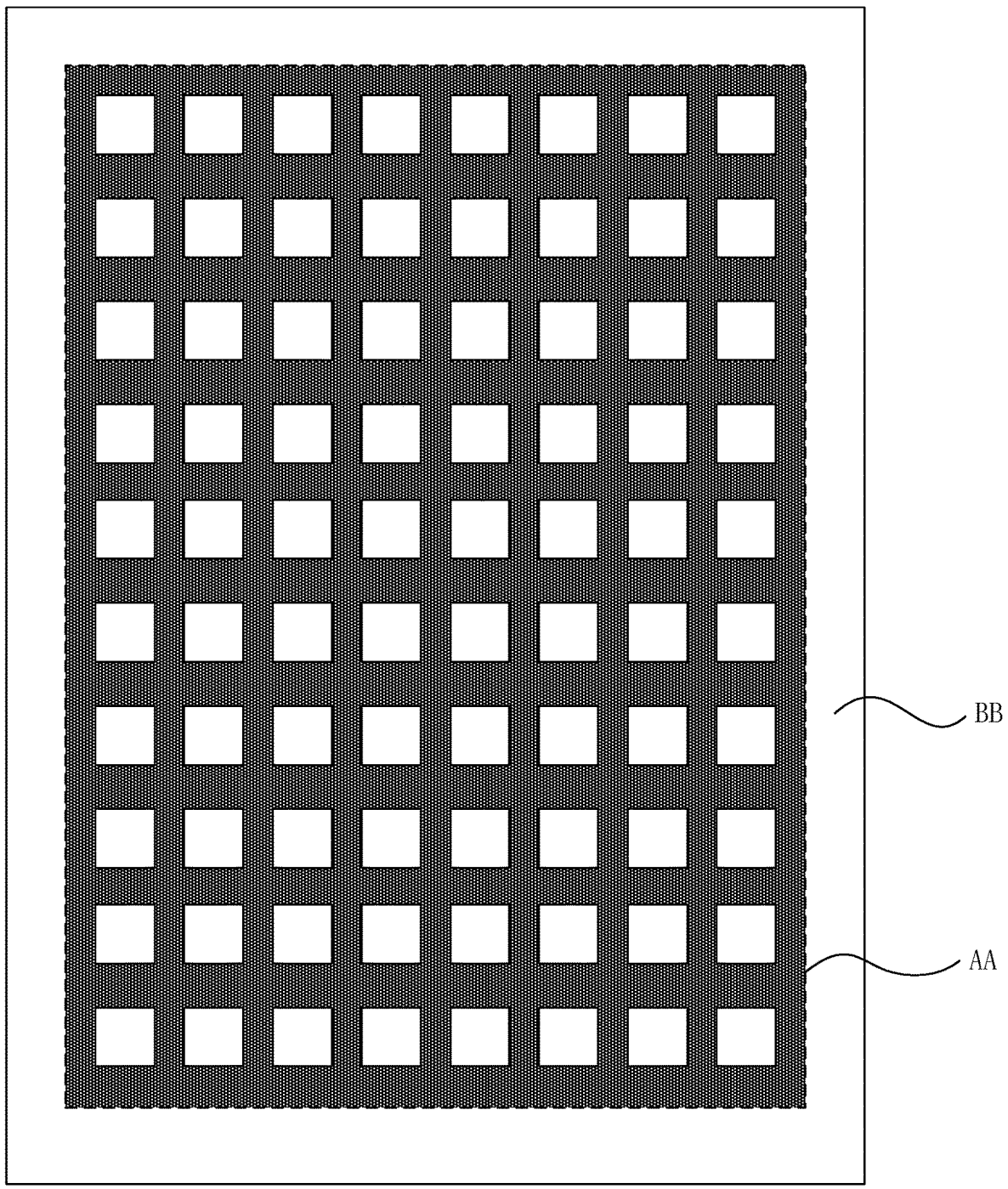
FIG. 1 is a schematic diagram of an organic light-emitting display panel according to an embodiment of the present disclosure.
Figure 2:
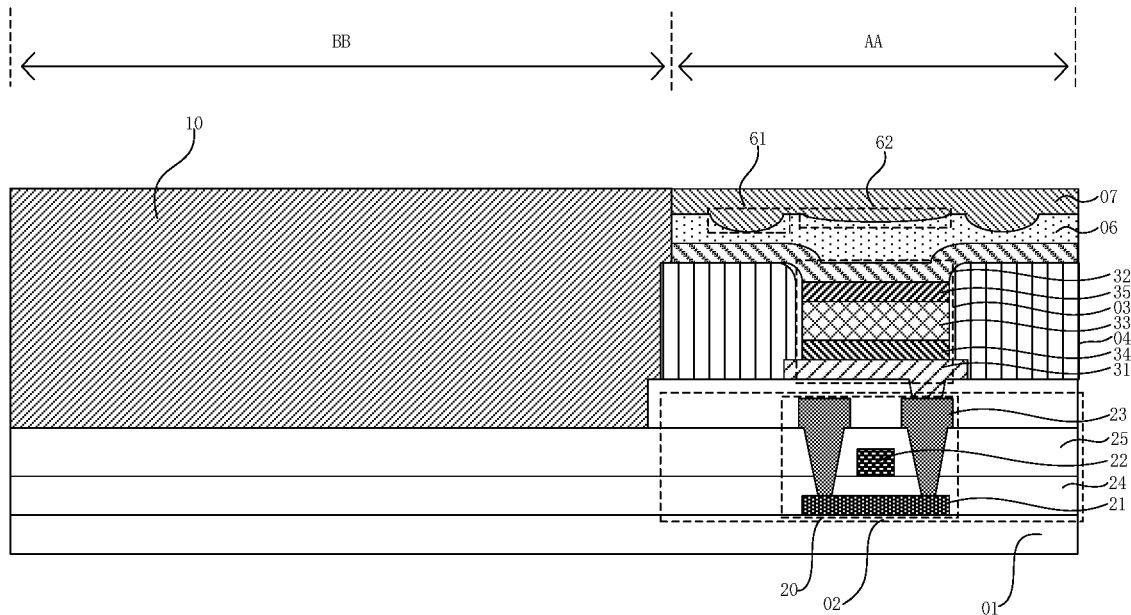
FIG. 2 is a cross-sectional view of an organic light-emitting display panel according to an embodiment of the present disclosure.
Figure 3:
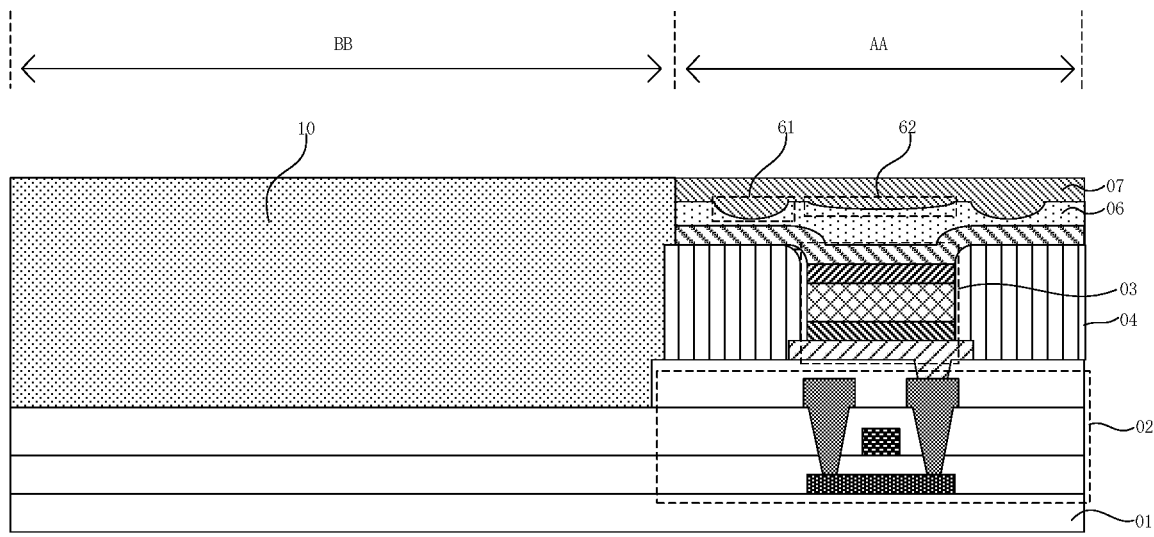
FIG. 3 is a cross-sectional view of an organic light-emitting display panel according to another embodiment of the present disclosure.
Figure 4:
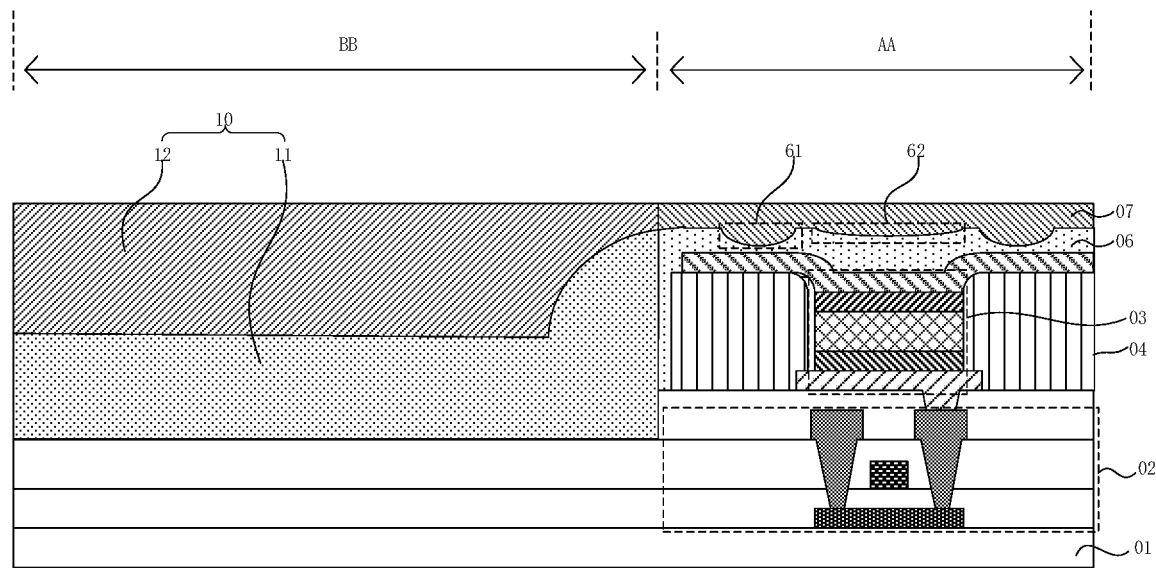
FIG. 4 is a cross-sectional view of an organic light-emitting display panel according to still another embodiment of the present disclosure.
Figure 5:
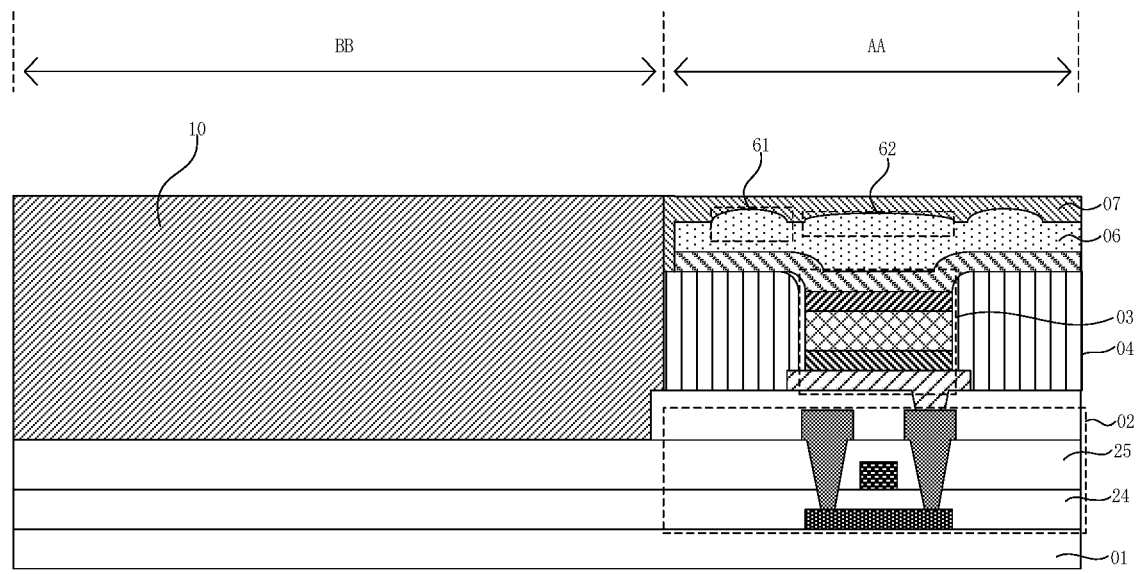
FIG. 5 is a cross-sectional view of an organic light-emitting display panel according to yet another embodiment of the present disclosure.

FIG. 1 is a schematic diagram of an organic light-emitting display panel according to an embodiment of the present disclosure. FIG. 2 is a cross-sectional view of an organic light-emitting display panel according to an embodiment of the present disclosure. FIG. 3 is a cross-sectional view of an organic light-emitting display panel according to another embodiment of the present disclosure. FIG. 4 is a cross-sectional view of an organic light-emitting display panel according to still another embodiment of the present disclosure. FIG. 5 is a cross-sectional view of an organic light-emitting display panel according to yet another embodiment of the present disclosure.

As shown in FIG. 1, an organic light-emitting display panel according to an embodiment of the present disclosure embodiment includes a display area AA and a non-display area BB surrounding the display area AA. The display area AA is an area in which light-emitting display is achieved, and the non-display area BB is an area in which peripheral circuits are arranged.

As shown in FIG. 2 to FIG. 5, the display area AA is provided with a substrate 01, a thin film transistor layer 02, an organic light-emitting layer, a microlens array layer 06, and a refractive index matching layer 07. The thin film transistor layer 02 is arranged at a side of the substrate 01. The organic light-emitting layer is arranged at a side of the thin film transistor layer 02 close to a light-exiting surface of the organic light-emitting display panel. The microlens array layer 06 is arranged at a side of the organic light-emitting layer close to the light-exiting surface of the organic light-emitting display panel. The refractive index matching layer 07 is arranged at a side of the microlens array layer 06 close to the light-exiting surface of the organic light-emitting display panel. That is, in the display area AA, the substrate 01, the thin film transistor layer 02, the organic light-emitting layer, the microlens array layer 06, and the refractive index matching layer 07 are sequentially (vertically) stacked along a direction from the substrate 01 to the light-exiting surface of the display panel.

With further reference to FIG. 2 to FIG. 5, the organic light-emitting layer includes a plurality of light-emitting pixels 03, each of which may include an anode 31, a cathode 32, and an organic light-emitting material layer 33 provided between the anode 31 and the cathode 32. A hole transport layer 34 is provided between the anode 31 and the organic light-emitting material layer 33, and an electron transport layer 35 is provided between the cathode 32 and the organic light-emitting material layer 33.

With further reference to FIG. 2 to FIG. 5, the microlens array layer 06 includes a plurality of microlenses 61/62 corresponding to the light-emitting pixels 03. For example, an orthographic projection of a microlens 61 corresponding to one light-emitting pixel 03 onto the substrate 01 surrounds an orthographic projection of the light-emitting pixel 03 onto the substrate 01, and/or an orthographic projection of a microlens 62 corresponding to one light-emitting pixel 03 onto the substrate 01 covers the an orthographic projection of the light-emitting pixel 03 onto the substrate. The microlens and the refractive index matching layer can operate to convert large-angle light into small-angle light, thereby improving a light-exiting efficiency of the light-emitting pixel 03 while preventing the large-angle light from reaching other light-emitting pixels 03, which would otherwise cause color mixing.

With further reference to FIG. 2 to FIG. 5, the refractive index matching layer 07 and the microlens array layer 06 have different refractive indexes. A surface of the microlens 61/62 in contact with the refractive index matching layer 07 is referred to as a first surface. The first surface is a curved surface and protrudes towards one of the microlens array layer 06 and the refractive index matching layer 07, which has a smaller refractive index. For example, as shown in FIG. 2 to FIG. 4, when the refractive index of the microlens array layer 06 is smaller than the refractive index of the refractive index matching layer 07, then the first surface of the microlens 61/62 in contact with the refractive index matching layer 07 protrudes towards the microlens array layer 06, that is, the microlens 61/62 included in the microlens array layer 06 is a concave lens. As shown in FIG. 5, when the refractive index of the refractive index matching layer 07 is smaller than the refractive index of the microlens array layer 06, then the first surface of the microlens 61/62 in contact with the refractive index matching layer 07 protrudes towards the refractive index matching layer 07, that is, the microlens 61/62 included in the microlens array layer 06 is a convex lens. It should be noted that the technical solutions involved in the following embodiments are applicable to both cases.

The thin film transistor layer 02 includes a plurality of inorganic layers and a plurality of metal layers, and the inorganic layers extend from the display area AA to the non-display area BB. As shown in FIG. 2, the thin film transistor layer 02 includes a plurality of thin film transistors 20, and each thin film transistor 20 includes an active layer 21, a gate electrode 22, and a source/drain electrode 23. A gate insulating layer 24 may be provided between the active layer 21 and the gate electrode 22. An intermediate insulating layer 25 may be provided between the gate electrode 22 and the source/drain electrode 23. That is, the plurality of inorganic layers included in the thin film transistor layer 02 includes a gate insulating layer 24 and an intermediate insulating layer 25, and both the gate insulating layer 24 and the intermediate insulating layer 25 extend from the display area AA to the non-display area BB. The plurality of metal layers included in the thin film transistor layer 02 include a metal layer arranged in the same layer as the gate electrode 22 and a metal layer arranged in the same layer as the source/drain electrode 23. It should be noted that the plurality of inorganic layers included in the thin film transistor layer 02 may further include other inorganic layers in addition to the gate insulating layer 24 and the intermediate insulating layer 25, and these other inorganic layers may also extend from the display area AA to non-display area BB.

With further reference to FIG. 2 to FIG. 5, the non-display area BB is provided with at least one filling layer 10 arranged at a side of the inorganic layer close to the light-exiting surface of the organic light-emitting display panel. A material of the filling layer 10 is the same as at least one of a material of the microlens array layer 06 and a material of the refractive index matching layer 07. As shown in FIG. 2 and FIG. 5, the material of the filling layer 10 may be only the same as the material of the refractive index matching layer 07. It should be noted that in FIG. 2 and FIG. 5, a filling pattern of the filling layer 10 is different from a filling pattern of the reflective index matching layer 07, in order to distinguish different positions and structures thereof from one another, rather than distinguishing materials thereof. As shown in FIG. 3, the material of the filling layer 10 may also be the same as the material of the microlens array layer 06. It should be noted that in FIG. 3, a filling pattern of the filling layer 10 is different from a filling pattern of the microlens array layer 06, in order to distinguish different positions and structures thereof from one another, rather than distinguishing materials thereof. As shown in FIG. 4, the at least one filling layer 10 includes a first filling layer 11 and a second filling layer 12 that are stacked. The first filling layer 11 and the microlens array layer 06 are made of a same material, and the second filling layer 12 and the refractive index matching layer 07 are made of a same material. It should be noted that in FIG. 4, a filling pattern of the filling layer 10 is different form a filling pattern of the refractive index matching layer 07, in order to distinguish different positions and structures thereof from one another, rather than distinguishing materials thereof; and the filling pattern of the filling layer 10 is different from a filling pattern of the microlens array layer 06, in order to distinguish different positions and structures thereof from one another, rather than distinguishing materials thereof.

The number of layers in the non-display area BB is smaller than the number of layers in the display area AA. For example, in a case in which the non-display area BB is provided with no organic light-emitting layer and no filling layer 10, there is a segment difference between the non-display area BB and the display area AA in a thickness direction of the organic light-emitting display panel, which would cause that a structure supposed to be continuous in both the display area AA and the non-display area BB be discontinuous due to the segment difference. For example, if a signal line needs to climb at a position between the display area AA and the non-display area BB, there may be a risk of breakage for the signal line. If a film needs to climb at a position between the display area AA and the non-display area BB, there may be a risk of breakage for the film. The segment difference between the display area AA and the non-display area BB caused by an inconsistency of the film layer in the reflective index matching layer 07 or the microlens array layer 06 can be filled by providing the filling layer 10 in the non-display area BB, which facilitates subsequent manufacturing of film layers or traces while achieving a good production yield. In addition, the filling layer 10 in the non-display area BB is arranged in the same layer as at least one of the microlens array layer 06 and/or the refractive index matching layer 07. Then, the filling layer 10 and the microlens array layer 06 and/or the refractive index matching layer 07 can be formed at the same time, thereby simplifying a process thereof.

In an embodiment of the present disclosure, as shown in FIG. 4, the at least one filling layer 10 includes a first filling layer 11 and a second filling layer 12 that are stacked. The first filling layer 11 and the microlens array layer 06 are made of a same material, and the second filling layer 12 and the refractive index matching layer 07 are made of a same material. Moreover, a refractive index of the microlens array layer 06 is greater than a refractive index of the refractive index matching layer 07, that is, a refractive index of the first filling layer 11 is greater than a refractive index of the second filling layer 12. Since light emitted from the display area AA is not absolutely collimated light, a part of the light will be emitted from the display area AA to the non-display area BB, and this part of the light has a large angle with respect to the thickness direction of the display apparatus. Further, the large-angle light incident to the non-display area BB will first pass through the first filling layer 11 and then the second filling layer 12 before being emitted towards the light exiting surface. That is, light will be emitted from an optically denser medium to an optically thinner (i.e., less dense) medium, so that total reflection will occur, thereby avoiding light leakage in the non-display area BB.

Figure 6:
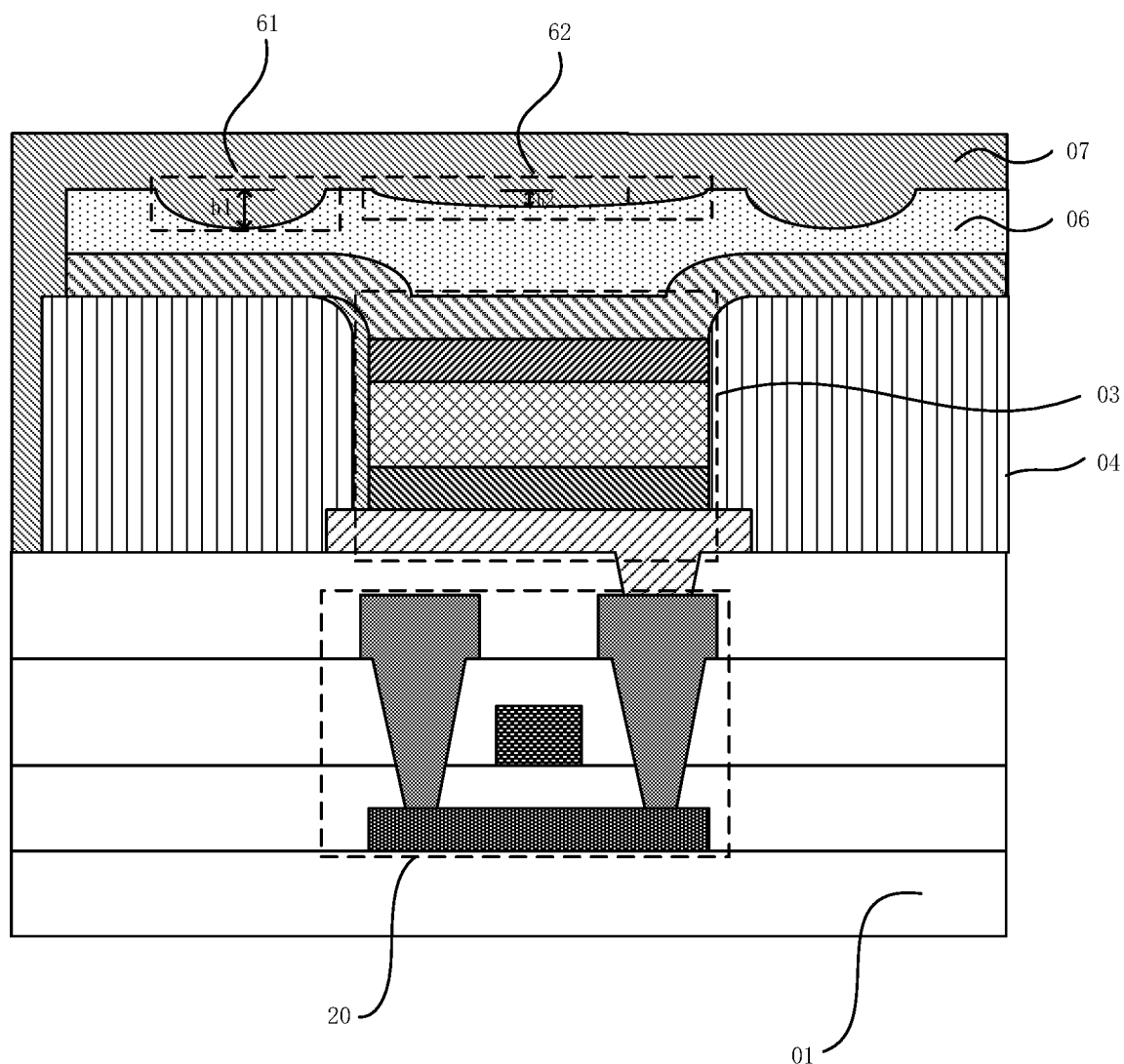
FIG. 6 is an enlarged view of a part of a display area shown in FIG. 2 to FIG. 5.

FIG. 6 is an enlarged view of a part of a display area shown in FIG. 2 to FIG. 5.

As shown in FIG. 6, the microlens array layer 06 may include a microlens 61 surrounding a region where the light-emitting pixel 03 is located. That is, the orthographic projection of the microlens 61 onto the substrate 01 is located outside and surrounds the orthographic projection of the light-emitting pixel 03 onto the substrate 01. In addition, the refractive index matching layer 07 also covers the microlens 61, and the curved surface of the microlens 61 protrudes towards one of the microlens array layer 06 and the reactive index matching layer 07, which has the smaller refractive index. Therefore, the microlens 61 and the refractive index matching layer 07 can convert large-angle light into small-angle light by refraction and reflection.

Usually, light emitted from the light-emitting pixel 03 is not a collimated light. That is, the light emitted from the light-emitting pixel 03 has a certain divergence angle, and the light emitted from the light-emitting pixel 03 and reaching a position above a periphery of the light-emitting pixel 03 has a large divergence angle. The large-angle light has a high probability of total reflection or dissipation after multiple refractions, which affects the light-exiting efficiency of the light-emitting pixel 03. The microlens 61 is arranged above the periphery of the light-emitting pixel 03, so as to convert large-angle light emitted from the light-emitting pixel 03 into small-angle light by reflection and refraction of the microlens 61 and the reflective index matching layer 07. Then, the light is emitted from the above of the microlens 61. This embodiment of the present disclosure increases an amount of light emitted from the periphery of the light-emitting pixel 03 without changing a light path of the light-emitting pixel 03 at a front viewing angle thereof, thereby improving the light-exiting efficiency of the display apparatus, reducing power consumption of the display apparatus and increasing a service life of the display apparatus. In addition, with the microlens 61, this embodiment of the present disclosure can prevent large-angle light from reaching light-emitting pixels adjacent thereto, which would otherwise cause color mixing.

In addition, the microlens layer 06 further includes a microlens 62 located above the light-emitting pixel 03, and the orthographic projection of the microlens 62 onto the substrate 01 can cover the orthographic projection of the light-emitting pixel 03 onto the substrate 01. In addition, the reflective index matching layer 07 also covers the microlens 62, and a curved surface of the microlens 62 also protrudes towards one of the microlens array layer 06 and the reflective index matching layer 07, which has the smaller refractive index. Then, the microlens 62 and the reflective index matching layer 07 can convert at least part of the large-angle light at a position corresponding to the light-emitting pixel 03 into small-angle light, thereby avoiding total reflection and thus improving the light-exiting efficiency.

In addition, for the microlens 61 and the microlens 62 corresponding to a same light-emitting pixel 03, a height of the curved surface of the microlens 61 may be larger than a height of the curved surface of the microlens 62, and then a refraction amplitude of the light by the microlens 61 is greater than a refraction amplitude of the light by the microlens 62. That is, a change in an angle of the light by the microlens 61 is greater than a change in an angle of the light by the microlens 62. Since there is a small probability for large-angle light occurring at the position corresponding to light-emitting pixel 03, and a maximum angle of the high-angle light at the position corresponding to light-emitting pixel 03 is usually smaller than a maximum angle of the high-angle light at other position, the angle of small-angle light will not be significantly changed when the microlens 62 converts the high-angle light to small-angle light, thereby avoiding divergence of light at a front viewing angle and avoiding an influence on the display effect.

Figure 7:
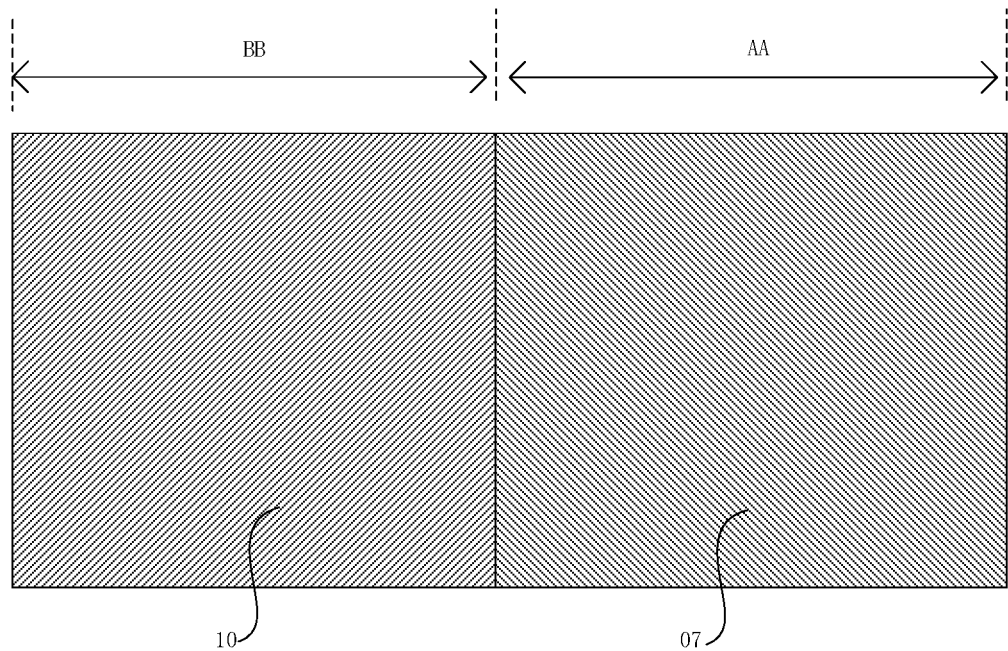
FIG. 7 shows orthographic projections of a filling layer and a refractive index matching layer shown in FIG. 2.
Figure 8:
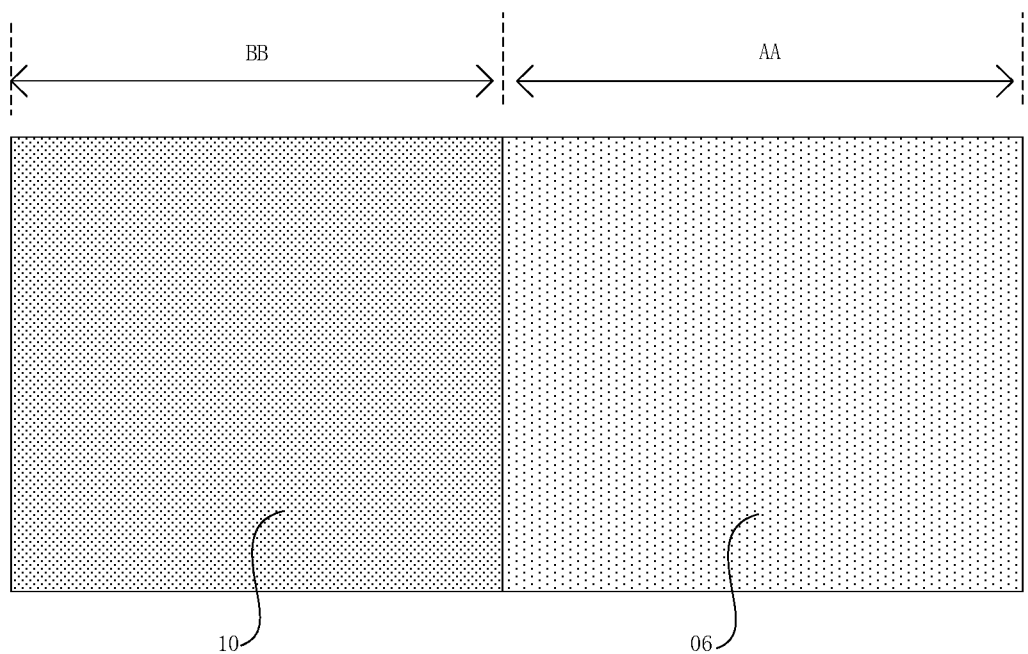
FIG. 8 shows orthographic projections of a filling layer and a microlens array layer shown in FIG. 3.
Figure 9:
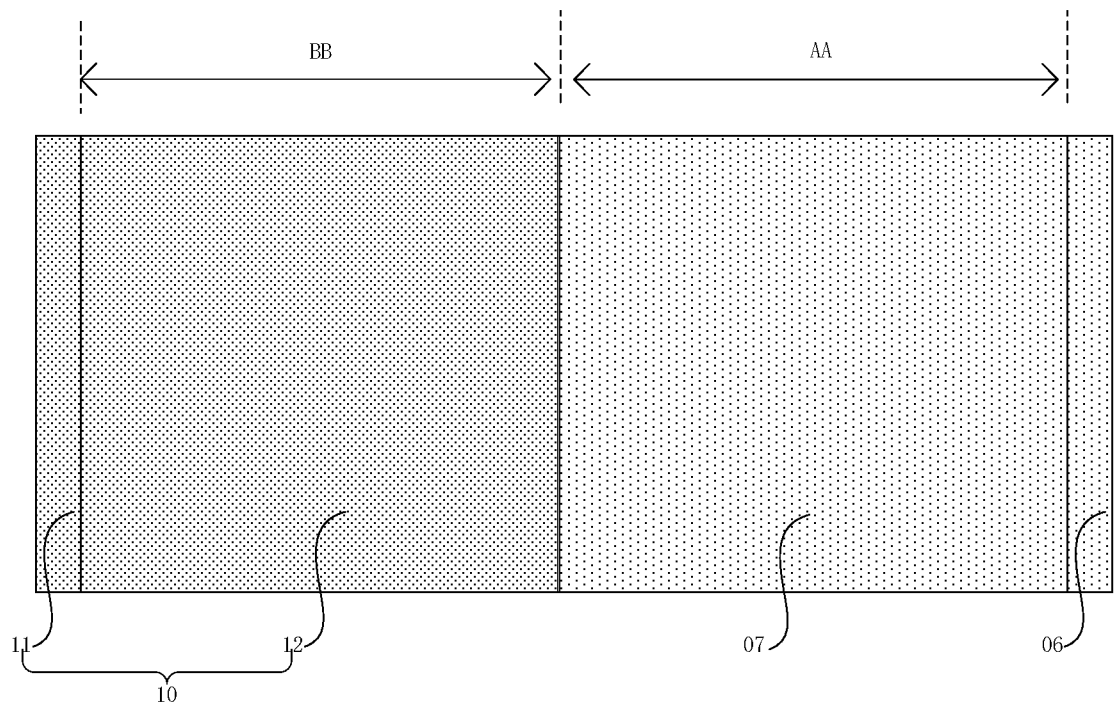
FIG. 9 shows orthographic projections of a filling layer, a microlens array layer, and a refractive index matching layer shown in FIG. 4.

FIG. 7 shows orthographic projections of a filling layer and a refractive index matching layer shown in FIG. 2. FIG. 8 shows orthographic projections of a filling layer and a microlens array layer shown in FIG. 3. FIG. 9 shows orthographic projections of a filling layer, a microlens array layer, and a refractive index matching layer shown in FIG. 4. As shown in FIGS. 2-5 and FIGS. 7-9, an orthographic projection of at least one of the microlens array layer 06 and the refractive index matching layer 07 on the light-exiting surface of the display apparatus is adjacent to an orthographic projection of the filling layer 10 onto the light-exiting surface of the display apparatus. In this embodiment of the present disclosure, the light-exiting surface of the display apparatus is in contact with an external environment. For example, if the display apparatus includes a glass cover located at the uppermost, a surface of the glass cover may be considered as the light-exiting surface of the display apparatus.

In combination with FIG. 2 and FIG. 7, when the material of the filling layer 10 is merely the same as the material of the refractive index matching layer 07, the orthographic projection of the filling layer 10 onto the light-exiting surface of the display apparatus is adjacent to the orthographic projection of the refractive index matching layer 07 onto the light-exiting surface of the light-exiting surface of the display apparatus. It can be understood that the filling layer 10 is actually a part of the reflective index matching layer 07 extending from the display area AA to the non-display area BB, that is, these two layers are manufactured at the same time.

In combination with FIG. 3 and FIG. 8, when the material of the filling layer 10 is merely the same as the material of the microlens array layer 06, the orthographic projection of the filling layer 10 onto the light-exiting surface of the display apparatus is adjacent to the orthographic projection of the microlens array layer 06 onto the light-exiting surface of the display apparatus. It can be understood that the filling layer 10 is actually apart of the microlens array layer 06 extending from the display area AA to the non-display area BB, that is, these two layers are manufactured at the same time.

In combination with FIG. 4 and FIG. 9, when the at least one filling layer 10 includes the first filling layer 11 and the second filling layer 12 that are made of materials that are the same as the material of the microlens array layer 06 and the material of the refractive index matching layer 07, respectively, then an orthographic projection of the first filling layer 11 onto the light-exiting surface of the display apparatus is adjacent to the orthographic projection of the microlens array layer 06 onto the light-exiting surface of the display apparatus, and an orthographic projection of the second filling layer 12 onto the light-exiting surface of the display apparatus is adjacent to the orthographic projection of the refractive index matching layer 07 onto the light-exiting surface of the display apparatus. It can be understood that the first filling layer 11 of the at least one filling layer 10 is actually a part of the microlens array layer 06 extending from the display area AA to the non-display area BB, that is, these two layers are manufactured at the same time. The second filling layer 12 is actually a part of the refractive index matching layer 07 extending from the display area AA to the non-display area BB, that is, these two layers are manufactured at the same time.

It should be noted that, since the segment difference between the non-display area BB and the display area AA is filled with the filling layer 10, which should have a flat surface, the filling layer 10 may be made of an organic material with good fluidity, such as an OCA adhesive. Correspondingly, one of the microlens array layer 06 and the refractive index matching layer 07 is made of the OCA adhesive.

Figure 10:
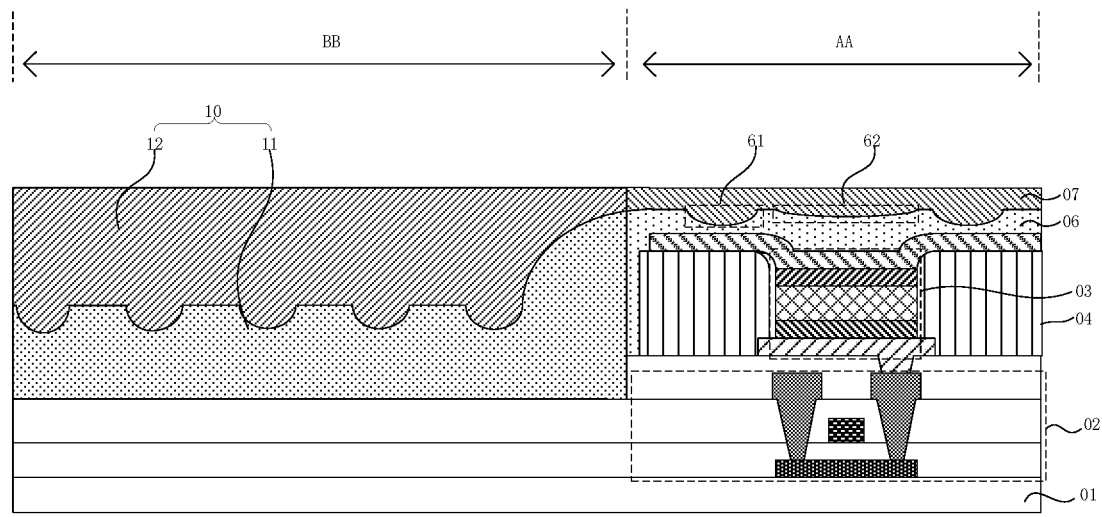
FIG. 10 is a cross-sectional view of another organic light-emitting display panel according to an embodiment of the present disclosure.

FIG. 10 is a cross-sectional view of another organic light-emitting display panel according to an embodiment of the present disclosure. As shown in FIG. 10, when at least one filling layer 10 includes the first filling layer 11 and the second filling layer 12, a contact surface between the first filling layer 11 and the second filling layer 12 is referred to as a second surface, which is an uneven surface. An uneven structure of the second surface may be substantially the same as a shape of the first surface in the display area. The unevenness of the second surface can be determined by an unevenness design of the first filling layer 11, and the first filling layer 11 can be formed as an uneven structure when the microlens 61/62 is formed in the microlens array layer 06.

By setting the contact surface between the first filling layer 11 and the second filling layer 12 as an uneven structure, a reliability of bonding between the first filling layer 11 and the second filling layer 12 can be increased. Meanwhile, a path along which external water and oxygen invades the display area AA from the non-display area BB can be increased, thereby preventing devices in the display area AA from being corroded by water and oxygen, so as to improve a reliability of the organic light-emitting display panel.

Figure 11:
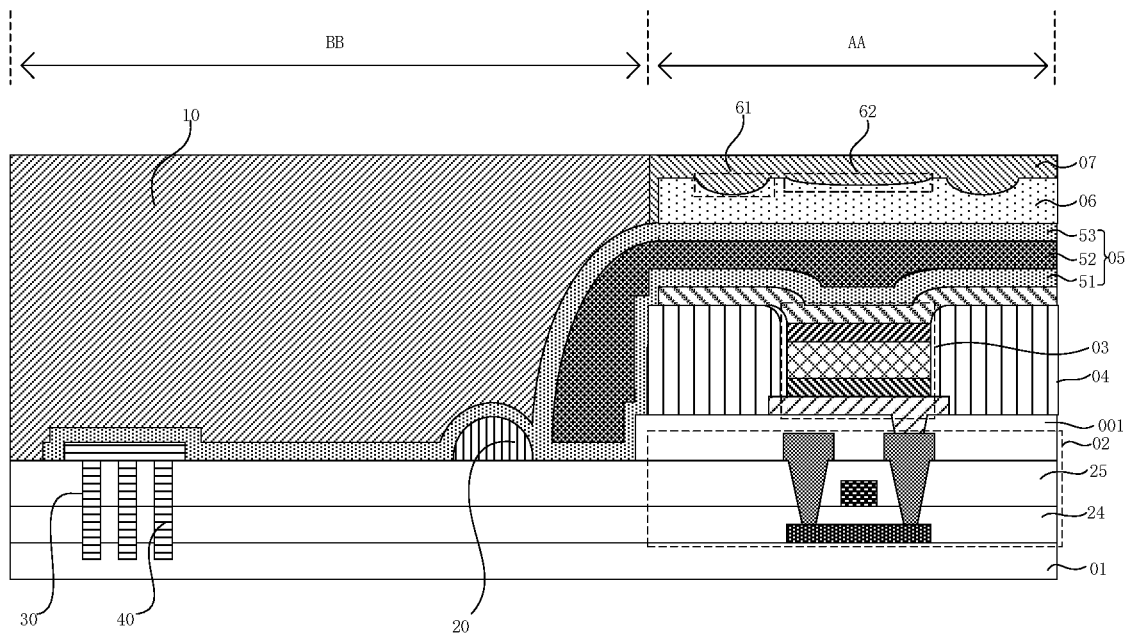
FIG. 11 is a cross-sectional view of still another organic light-emitting display panel according to an embodiment of the present disclosure.
Figure 12:
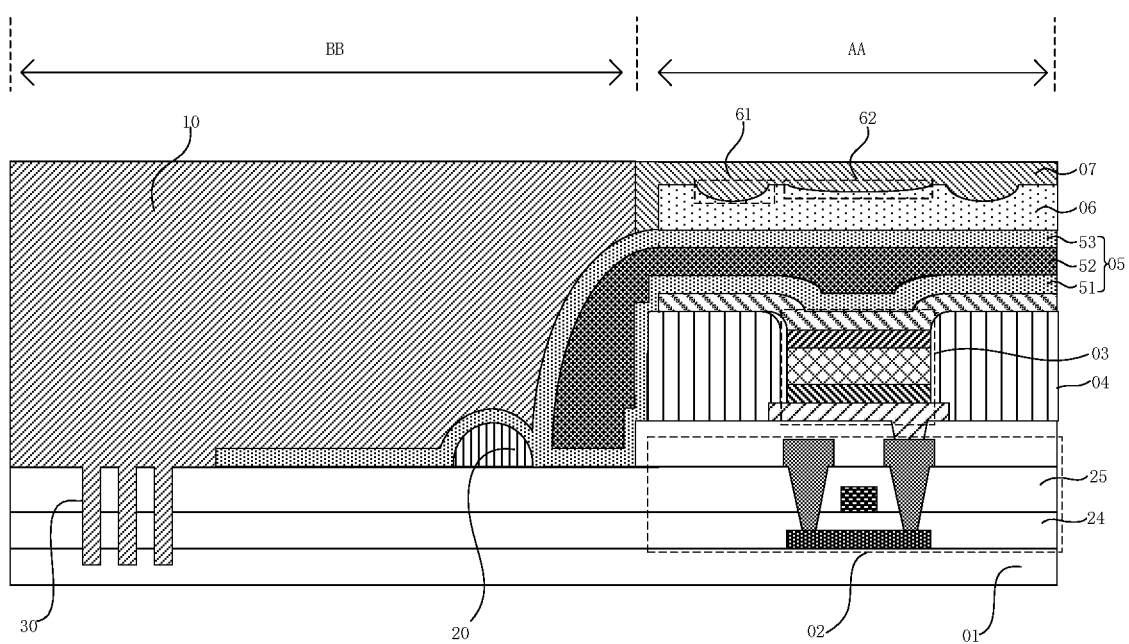
FIG. 12 is a cross-sectional view of still another organic light-emitting display panel according to another embodiment of the present disclosure.
Figure 13:
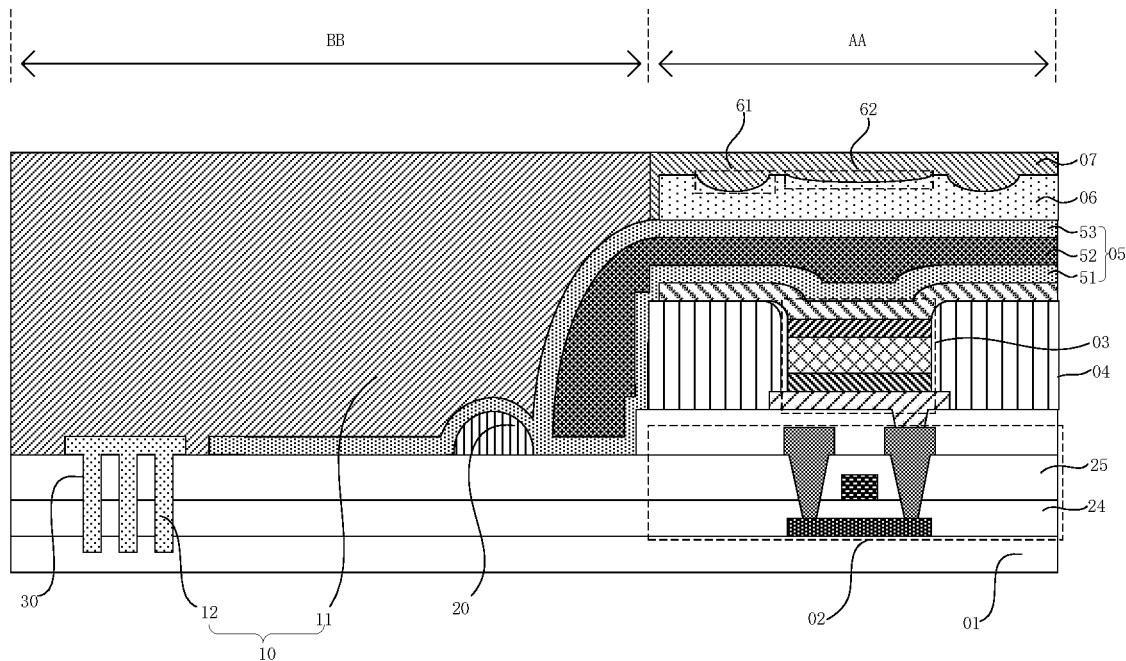
FIG. 13 is a cross-sectional view of still another organic light-emitting display panel according to still another embodiment of the present disclosure.

FIG. 11 is a cross-sectional view of still another organic light-emitting display panel according to an embodiment of the present disclosure. FIG. 12 is a cross-sectional view of still another organic light-emitting display panel according to another embodiment of the present disclosure. FIG. 13 is a cross-sectional view of still another organic light-emitting display panel according to still another embodiment of the present disclosure.

As shown in FIG. 11 to FIG. 13, the organic light-emitting display panel according to an embodiment of the present disclosure further includes an encapsulation layer 05 provided between the organic light-emitting layer and the microlens array layer 06. The encapsulation layer 05 includes at least a first inorganic layer 51, a first organic layer 52, and a second inorganic layer 53 that are sequentially stacked. The encapsulation layer 05 can prevent external water and oxygen from eroding the organic light-emitting layer.

The encapsulation layer 05 extends from the display area AA to a part of the non-display area BB. With further reference to FIG. 11 and FIG. 12, the non-display area BB is further provided with a barrier wall 20 surrounding the display area AA. The barrier wall 20 can block a transmission path of external water and oxygen, thereby improving a reliability of the organic light-emitting display panel. The first organic layer 52 of the encapsulation layer 05 extends from the display area AA to a region between the barrier wall 20 and the display area AA. That is, when the encapsulation layer 05 extends from the display area AA to the non-display area BB, the first organic layer 52 stops before reaching the barrier wall 20.

As shown in FIG. 11 to FIG. 12, for the organic light-emitting display panel according to an embodiment of the present disclosure, the inorganic layer in the non-display area BB includes a second through hole 30 formed at a side of the barrier wall 20 facing away from the display area AA. Due to a brittle texture of the inorganic layer, the inorganic layer is prone to form a crack during a process of forming the organic light-emitting display panel by cutting. The second through hole 30 formed in the inorganic layer in the non-display area BB can prevent the crack from extending to the display area AA.

With reference to FIG. 11, the non-display area BB is further provided with a third filling structure 40, which is made of an organic material. Further, the second through hole 30 formed in the inorganic layer in the non-display area BB is filled with the third filling structure 40, and at least one of the first inorganic layer 51 and the second inorganic layer 53 of the encapsulation layer 05 extends from the display area AA to the non-display area BB and covers the third filling structure 40. By filling the second through hole 30 with the organic filling structure, a risk of the crack extending to the display area AA can be more effectively avoided.

With further reference to FIG. 11, the display area AA is further provided with a planarization layer 001 arranged between the organic light-emitting layer and the thin film transistor layer 02. The planarization layer 001 can provide a flat bearing surface for the organic light-emitting layer. In an embodiment of the present disclosure, the third filling structure 40 and the planarization layer 001 are made of a same material, and thus the third filling structure 40 and the planarization layer 001 can be made at the same time.

As shown in FIG. 12, the first inorganic layer 51 or the second inorganic layer 53 extends from the display area AA to a region between the second through hole 30 and the barrier wall 20 and stops between the second through hole 30 and the barrier wall 20. The second through hole 30 is filled with the filling layer 10.

In an embodiment of the present disclosure, as shown in FIG. 12, when the filling layer 10 and the reflective index matching layer 07 are made of a same material, then the second through hole 30 is filled with a part of the filling layer 10. That is, the reflective index matching layer 07 is used in filling of the second through hole 30 while extending from the display area AA to the non-display area BB, thereby simplifying a manufacturing process thereof. In an embodiment of the present disclosure, when the filling layer 10 and the microlens array layer 06 are made of a same material, a part of the filling layer 10 is still located in the second through hole 30. That is, the microlens array layer 06 is used in filling of the second through hole 30 while extending from the display area AA to the non-display area BB, thereby simplifying a manufacturing process thereof.

In an embodiment of the present disclosure, as shown in FIG. 13, when the at least one filling layer 10 includes the first filling layer 11 and the second filling layer 12 made of materials which are the same as the material of the microlens array layer 06 and the material of the refractive index matching layer 07, respectively, the first filling layer 11 may be located in the second through hole 30 and the second filling layer 12 covers the first filling layer 11.

Figure 14:
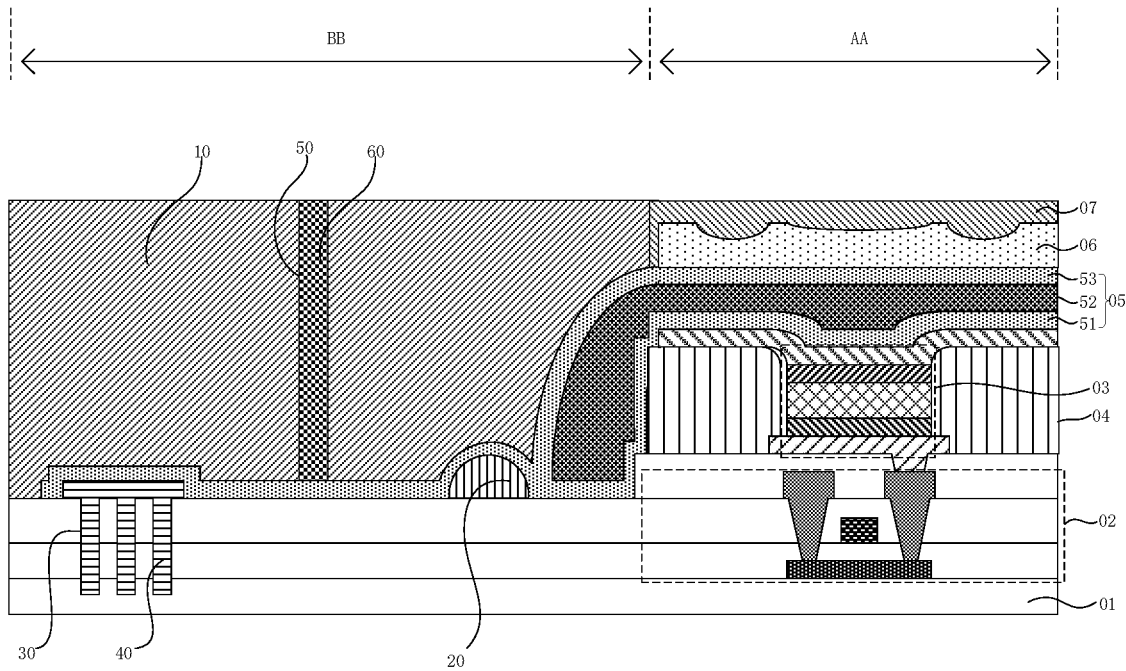
FIG. 14 is a cross-sectional view of yet another organic light-emitting display panel according to an embodiment of the present disclosure.
Figure 15:
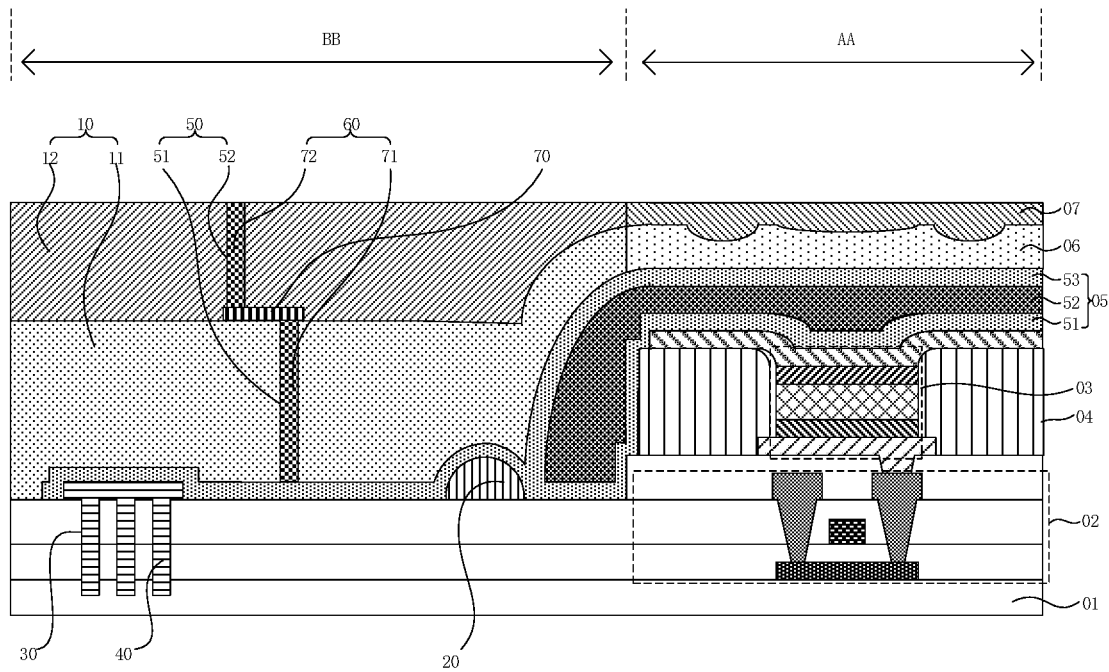
FIG. 15 is a cross-sectional view of yet another organic light-emitting display panel according to another embodiment of the present disclosure.
Figure 16:
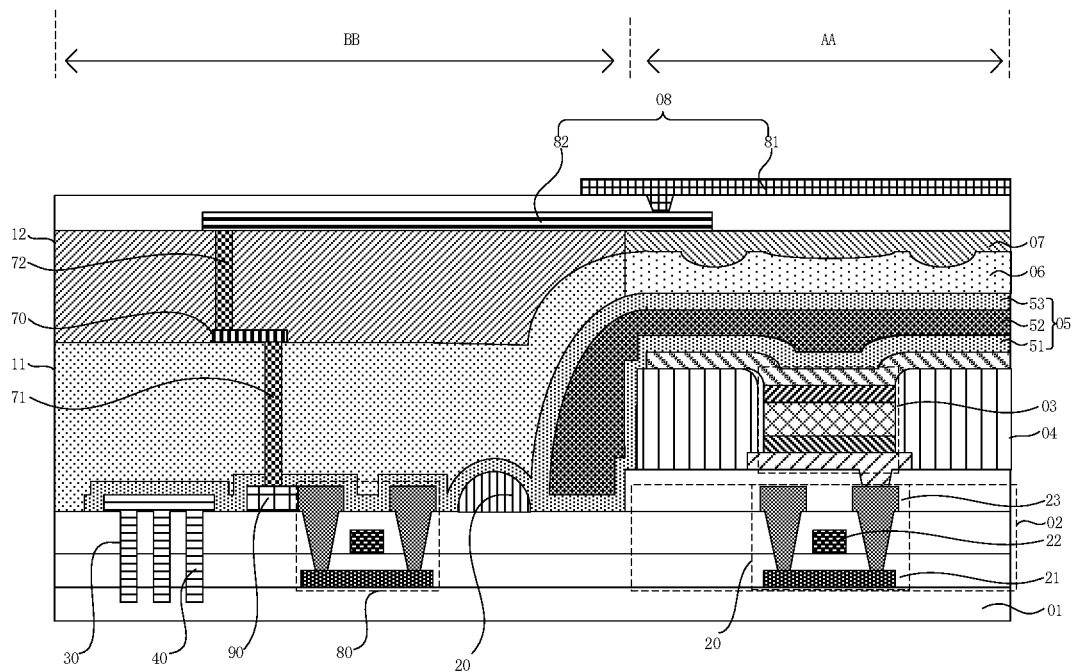
FIG. 16 is a cross-sectional view of yet another organic light-emitting display panel according to still another embodiment of the present disclosure.

FIG. 14 is a cross-sectional view of yet another organic light-emitting display panel according to an embodiment of the present disclosure. FIG. 15 is a cross-sectional view of yet another organic light-emitting display panel according to another embodiment of the present disclosure. FIG. 16 is a cross-sectional view of yet another organic light-emitting display panel according to still another embodiment of the present disclosure.

As shown in FIG. 14 and FIG. 15, for the organic light-emitting display panel provided by this embodiment of the present disclosure, the filling layer 10 further includes a first through hole 50 filled with a first filling structure 60. As shown in FIG. 14 and FIG. 15, the first through hole 50 may penetrate the filling layer 10, and the first through hole 50 may surround the display area AA.

In an embodiment of the present disclosure, the first filling structure 60 located in the first through hole 50 may be made of an inorganic insulating material. That is, the filling layer 10 is provided with the first filling structure, which is made of an inorganic insulating material, penetrates a total thickness of the filling layer 10 and surrounds the display area AA. In this way, a combination of the filling layer 10 and the first filling structure 60 can effectively prevent water and oxygen from diffusing into the display area AA from the filling layer 10.

In an embodiment of the present disclosure, the first filling structure 60 located in the first through hole 50 may also be made of a conductive material. In this case, the first filling structure 60 may electrically conduct the conductive structures above and below the filling layer 10.

When the first filling structure 60 is made of a conductive material, the first filling structure 60 may be made of a silver colloid. If the filling layer 10 is thick, the corresponding first through hole 50 is deep. Since the silver colloid has good fluidity, the first through hole 50 can be more reliably filled with the silver colloid without a risk of breakage.

As shown in FIG. 15, when the at least one filling layer 10 includes the first filling layer 11 and the second filling layer 12 made of materials which are the same as the material of the microlens array layer 06 and the material of the reflective index matching layer 07, respectively, the first through hole 50 may include a first sub-through hole 51 penetrating the first filling layer 11. A second sub-through hole 52 penetrating the second filling layer 12, and the first filling structure 60 may include a first sub-filling structure 71 and a second sub-filling structure 72. The first sub-filling structure 71 is provided in the first sub-through hole 51, and the second sub-filling structure 72 is provided in the second sub-through hole 52. When the first filling structure 60 is made of a conductive material, the corresponding first sub-filling structure 71 and second sub-filling structure 72 are each made of a conductive material.

With further reference to FIG. 15 and FIG. 16, when the first sub-filling structure 71 and the second sub-filling structure 72 are each made of a conductive material, a conductive block 70 may be further provided between the first filling layer 11 and the second filling layer 12. The conductive block 70 includes an end electrically connected to the first sub-filling structure 71, and another end electrically connected to the second sub-filling structure 72. An area of the conductive block 70 is larger than an area of a top surface of the first sub-filling structure 71 and an area of a bottom surface of the second sub-filling structure 72. Due to the limitation of an accuracy of a process thereof, as shown in FIG. 15 and FIG. 16, there is a deviation between the first sub-through hole 51 and the second sub-through hole 52. Since the area of the conductive block 70 is larger, the top surface of the first sub-filling structure 71 can still be in contact with the conductive block 70 even in a case of a large process deviation. Likewise, the bottom surface of the second sub-filling structure 72 can also be in contact with the conductive block 70 even in a case of a large process deviation. That is, even if there is a deviation between the first sub-through hole 51 and the second sub-through hole 52, the first sub-filling structure 71 can still be electrically connected to the second sub-filling structure 72 through the conductive block, thereby improving a reliability of an electrical connection therebetween.

With reference to FIG. 16, in an embodiment of the present disclosure, the organic light-emitting display panel further includes a touch layer 08. The touch layer 08 includes a touch electrode 81 and a touch wire 82 electrically connected to the touch electrode 81. The touch electrode 81 is configured to sense a touch operation, and the touch wire 82 is configured to transmit a touch signal for the touch electrode 81. It should be noted that the touch electrode 81 can be used for self-capacitance touch or mutual-capacitance touch.

As shown in FIG. 16, the touch layer 08 is located at a side of the reflective index matching layer 07 close to the light-exiting surface of the organic light-emitting display panel. That is, at least the reflective index matching layer 07 and the microlens array layer are provided between the touch layer 08 and the organic light-emitting layer. In addition, the encapsulation layer 05 may be further provided between the touch layer 08 and the organic light-emitting layer. Then, a distance between the touch electrode 81 of the touch layer 08 and the cathode 32 of the light-emitting pixel 03 increases, thereby decreasing a parasitic capacitance between the touch electrode 81 and the cathode 32. In addition, the touch wire 82 extends from the display area AA to the non-display area BB and is located above the reflective index matching layer 07, and thus the touch wire 82 in the non-display area BB is located above the filling layer 10. In this case, there is no segment difference when the touch trace 82 extends from the display area AA to the non-display area BB, thereby achieving continuity of the touch wire 82.

In addition, the non-display area BB is further provided with a touch connecting line 90 electrically connected to the touch wire 82. The touch wire 82 and the touch connection wire 90 are arranged in different layers. As shown in FIG. 16, the touch wire 82 can be arranged in the same layer as at least one metal layer of the thin film transistor layer 02. For example, the touch wire 82 can be arranged in the same layer as a metal layer where the gate electrode 22 is arranged or a metal layer where the source/drain electrode 23 is arranged. When the thin film transistor layer 02 further includes other metal layer, the touch wire 82 may also be arranged in the same layer as the other metal layer.

In an embodiment of the present disclosure, only a part of the touch wire 82 is electrically connected to the touch connecting line 90 through the first filling structure 60. Then signal lines that provide signals for the touch electrode 81 may be arranged in two layers, thereby decreasing a number of signal lines arranged in a same layer in the non-display area BB. Therefore, a width of the non-display area BB can be decreased.

As shown in FIG. 16, the touch connecting line 90 is located at a side of the filling layer 10 facing away from the light-exiting surface of the organic light-emitting display panel, and the touch wire 82 is located at a side of the filling layer 10 close to the light-exiting surface of the organic light-emitting display panel. In this case, the touch wire 82 is electrically connected to the touch connecting line 90 in such a manner that the touch wire 82 is electrically connected to an end of the first filling structure 60 and the touch connecting line 90 is electrically connected to another end of the first filling structure 60.

When the at least one filling layer 10 includes the first filling layer 11 and the second filling layer 12 and the first filling structure 60 includes the first sub-filling structure 71 and the second sub-filling structure 72, the touch wire 82 may be electrically connected to the second sub-filling structure 72, and the touch connecting line 61 may be electrically connected to the first sub-filling structure 71.

In an embodiment of the present disclosure, the non-display area BB is provided with a plurality of multiplexers 80, and the display area AA is provided with a plurality of thin film transistors 20. The multiplexers 80 and the thin film transistors 20 are arranged in a same layer. Since the microlens array layer 06 and the refractive index matching layer 07 are arranged between the touch layer 08 and the thin film transistor layer 02, then the filling layer 10 is arranged between the touch wire 82 and the multiplexers 80. The multiplexer 80 can control a signal to be inputted or outputted through the touch wire 82, and thus the touch wire 82 may be electrically connected to an output terminal of the multiplexer 80. In this embodiment, the touch connecting line 90 may be arranged in the same layer with and electrically connected to the output terminal of the multiplexer 80, so that the touch wire 82 is electrically connected to the output terminal of the multiplexer 80.

Figure 17:
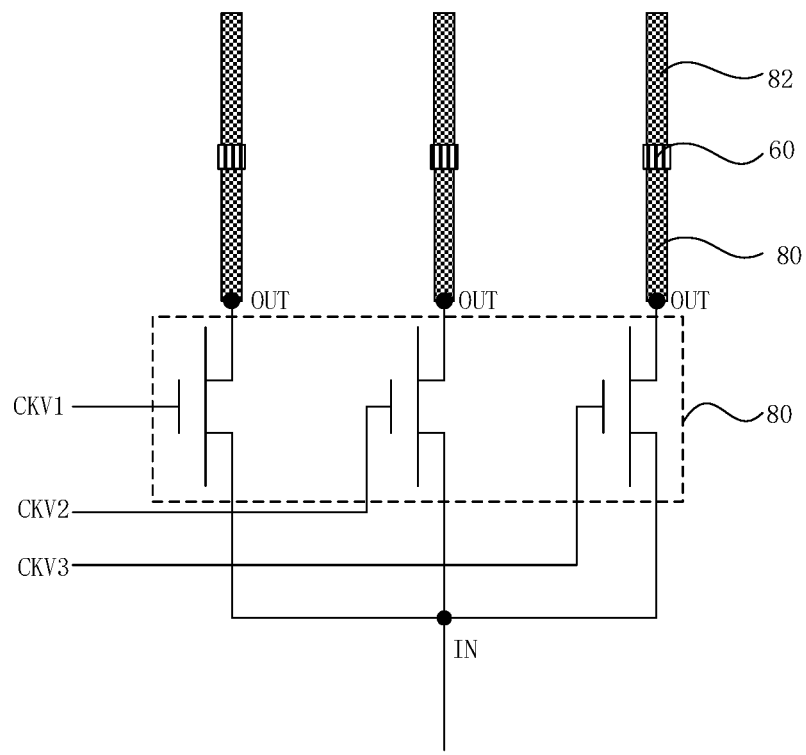
FIG. 17 is an equivalent circuit diagram of a multiplexer according to an embodiment of the present disclosure.

FIG. 17 is an equivalent circuit diagram of a multiplexer according to an embodiment of the present disclosure.

As shown in FIG. 17, the multiplexer 80 includes one input terminal IN and multiple output terminals OUT, and the multiplexer 80 includes multiple control terminals for controlling a signal at the input terminal IN to be transmitted to different output terminals in a time division manner. As shown in FIG. 17, a control terminal CKV1 can control the signal at the input terminal IN to be transmitted to a left output terminal OUT, a control terminal CKV2 can control the signal of the input terminal IN to be transmitted to a middle output terminal OUT, and the control terminal CKV3 can control the signal at the input terminal IN to be transmitted to a right output terminal OUT. It should be noted that the cross-sectional view shown in FIG. 16 illustrates a structure corresponding to one input terminal and one output terminal of the multiplexer 80. In combination with FIG. 16 and FIG. 17, one output terminal OUT is electrically connected to one touch connecting line 90, and multiple output terminals OUT may be electrically connected to different touch connecting lines 90. With the multiplexer 80, a number of signal lines for transmitting signals for the touch wire 82 can be decreased, that is, the number of signal lines is decreased to the number of signal lines connected to the input terminal IN. Therefore, the width of the non-display area BB can be decreased.

Figure 18:
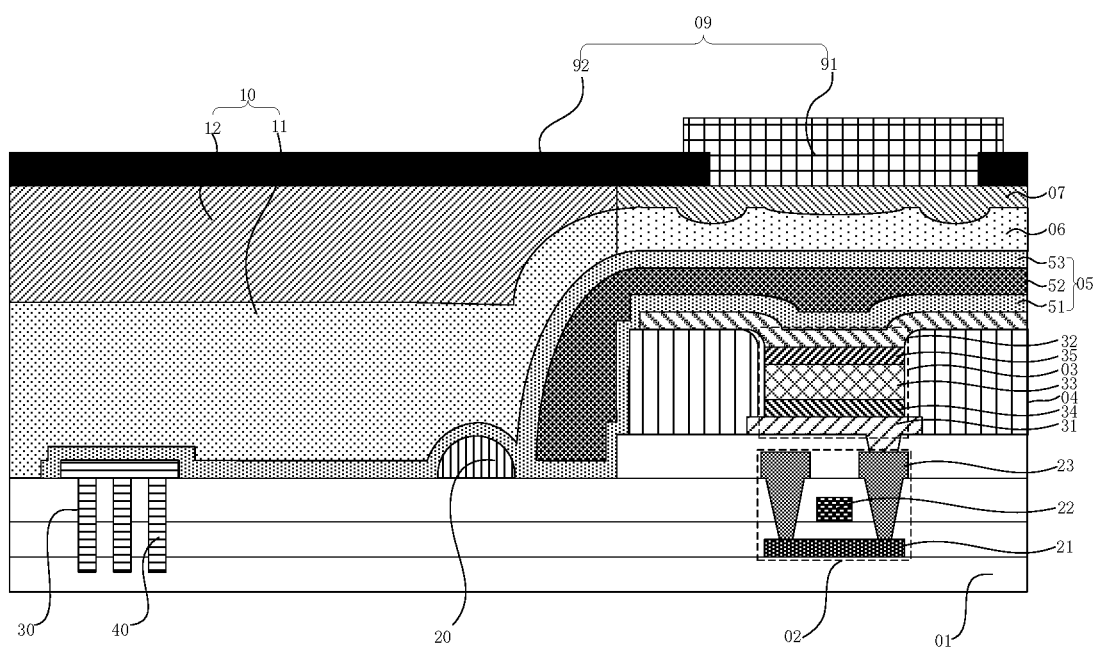
FIG. 18 is a cross-sectional view of still yet another organic light-emitting display panel according to an embodiment of the present disclosure.

FIG. 18 is a cross-sectional view of yet another organic light-emitting display panel according to an embodiment of the present disclosure.

As shown in FIG. 18, the organic light-emitting display panel according to this embodiment of the present disclosure further includes a color resist layer 09, which includes color resists 91 and a black matrix 92. The color resist layer 09 is located a side of the refractive index matching layer 07 close to the light-exiting surface of the organic light-emitting display panel. By providing the color resist layer 09 on the microlens array layer 06 and the reflective index matching layer 07, a part of the color resist layer 09 extending to the non-display area BB can be prevented from a risk of breakage due to a segment difference in the thickness of the film layer.

The black matrix 92 extends from the display area AA to the non-display area BB. By extending the black matrix 92 from the display area AA to the non-display area BB, a risk of light leakage in the non-display area BB can be avoided.

With further reference to FIG. 18, the color resists 91 include at least three colors, and each of the color resists 91 corresponds to a respective light-emitting pixel 03 emitting light of a same color as the color resist in one-to-one correspondence. For example, a red color resist 91 corresponds to a light-emitting pixel 03 that emits red light, a green color resist 91 corresponds to the light-emitting pixel 03 that emits green light, and a blue color resist 91 corresponds to the light-emitting pixel 03 that emits blue light. An orthographic projection of the color resist 91 onto the organic light-emitting layer covers the light-emitting pixel 03, and an orthographic projection of the black matrix 92 onto the organic light-emitting layer is located between two adjacent light-emitting pixels 03. By providing the color resists on the organic display panel, color purity can be improved without a polarizer, and thus light reflection caused by the polarizer can be avoided.

Figure 19:
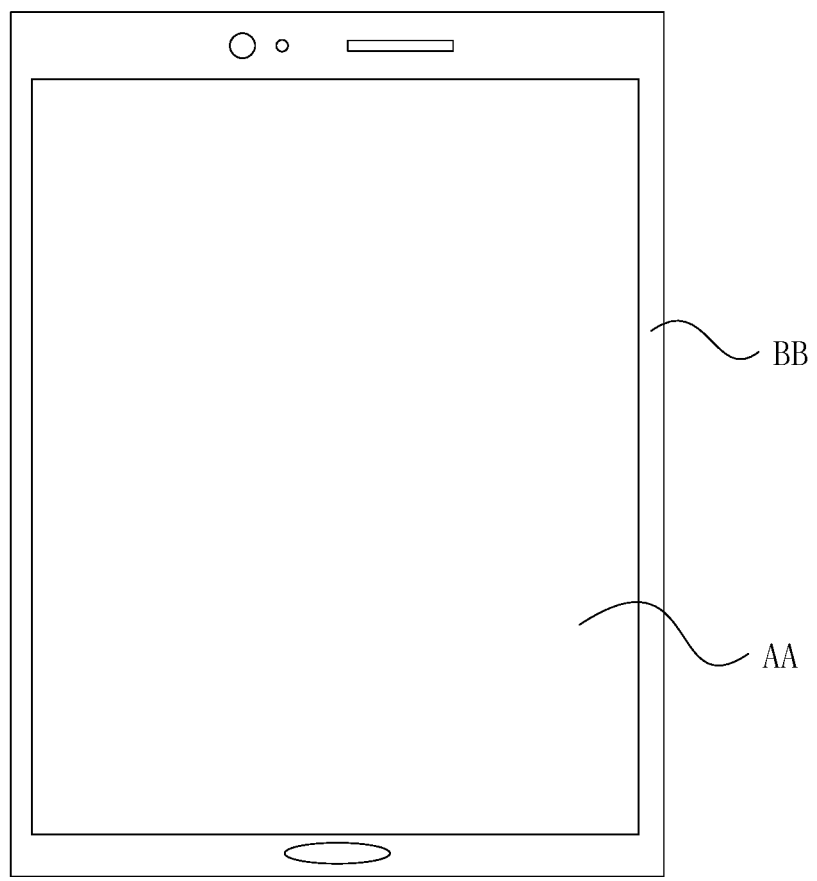
FIG. 19 is a schematic diagram of an organic light-emitting display apparatus according to an embodiment of the present disclosure.

FIG. 19 is a schematic diagram of an organic light-emitting display apparatus according to an embodiment of the present disclosure. The organic light-emitting display apparatus according to the embodiment of the present disclosure includes the organic light-emitting display panel provided by any one of the above-described embodiments. As shown in FIG. 19, the display apparatus according to the embodiment of the present disclosure may be a mobile phone. In addition, the display apparatus provided by this embodiment of the present disclosure may also be a display apparatus such as a computer or a television. As shown in FIG. 19, the organic light-emitting display apparatus according to this embodiment of the present disclosure includes a display area AA corresponding to the organic light-emitting display panel and a non-display area BB corresponding to the organic light-emitting display panel.

The segment difference between the display area AA and the non-display area BB caused by an inconsistency of the film layer between the reflective index matching layer 07 or the microlens array layer 06 can be filled by providing the filling layer 10 in the non-display area BB, which facilitates subsequent manufacturing of film layers or traces while achieving a good production yield. In addition, the filling layer 10 in the non-display area BB is arranged in the same layer as at least one of the microlens array layer 06 and/or the refractive index matching layer 07. Then, the filling layer 10 and the microlens array layer 06 and/or the refractive index matching layer 07 can be formed at the same time, thereby simplifying a process thereof.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. An organic light-emitting display panel having a display area and a non-display area surrounding the display area, the organic light-emitting display panel comprising:
   a thin film transistor layer provided in the display area;
   an organic light-emitting layer provided in the display area and located at a side of the thin film transistor layer close to a light-exiting surface of the organic light-emitting display panel;
   a microlens array layer provided in the display area and located at a side of the organic light-emitting layer close to the light-exiting surface of the organic light-emitting display panel;

a refractive index matching layer provided in the display area and located at a side of the microlens array layer close to the light-exiting surface of the organic light-emitting display panel; and at least one filling layer provided in the non-display area, wherein the organic light-emitting layer comprises a plurality of light-emitting pixels, the microlens array layer comprises a plurality of microlenses corresponding to the plurality of light-emitting pixels, the refractive index matching layer and the microlens array layer have different refractive indexes, each of the plurality of microlenses comprises a first surface that is in contact with the refractive index matching layer, and the first surface is a curved surface protruding towards one of the microlens array layer and the refractive index matching layer, which has a smaller refractive index, the thin film transistor layer comprises a plurality of inorganic layers extending from the display area to the non-display area, and the at least one filling layer is arranged at a side of the plurality of inorganic layers close to the light-exiting surface of the organic light-emitting display panel, and a material of each of the at least one filling layer is same as with at least one of a material of the microlens array layer and a material of the refractive index matching layer.

2. The organic light-emitting display panel according to claim 1, wherein an orthographic projection of at least one of the microlens array layer and the reflective index matching layer onto the light-exiting surface is adjacent to an orthographic projection of one of the at least one filling layer onto the light-exit surface.

3. The organic light-emitting display panel according to claim 1, wherein the at least one filling layer comprises a first through hole filled with a first filling structure, and the first filling structure is made of an inorganic insulating material.

4. The organic light-emitting display panel according to claim 1, wherein the at least one filling layer comprises a first through hole filled with a first filling structure, and the first filling structure is made of a conductive material.

5. The organic light-emitting display panel according to claim 4, wherein the first filling structure is made of a silver colloid.

6. The organic light-emitting display panel according to claim 4, wherein the at least one filling layer comprises a first filling layer and a second filling layer that are stacked, a material of the first filling layer is same as the material of the microlens array layer, and a material of the second filling layer is same as the material of the refractive index matching layer.

7. The organic light-emitting display panel according to claim 6, wherein the first filling layer comprises a second surface that is in contact with the second filling layer, and the second surface is an uneven surface.

8. The organic light-emitting display panel according to claim 6, wherein the first through hole comprises a first sub-through hole penetrating the first filling layer and a second sub-through hole penetrating the second filling layer;

the first filling structure comprises a first sub-filling structure located in the first sub-through hole and a second sub-filling structure located in the second sub-through hole; and a conductive block is provided between the first filling layer and the second filling layer and is configured to electrically connect the first sub-filling structure with the second sub-filling structure.

9. The organic light-emitting display panel according to claim 8, further comprising:

a touch layer located at a side of the refractive index matching layer close to the light-exiting surface of the organic light-emitting display panel, the touch layer comprising a touch electrode and a touch wire electrically connected to the touch electrode, and the touch wire extending from the display area to the non-display area; and a plurality of touch connecting lines provided in the non-display area and arranged at a side of the at least one filling layer facing away from the light-exiting surface of the organic light-emitting display panel, one of the plurality of touch connecting lines being connected to the first sub-filling structure connection, and the touch wire being connected to the second sub-filling structure.

10. The organic light-emitting display panel according to claim 9, wherein in the display area, the thin film transistor layer further comprises a plurality of metal layers, and one of the plurality of touch connecting lines and at least one metal layer of the plurality of metal layers are arranged in a same layer.

11. The organic light-emitting display panel according to claim 9, further comprising:

a plurality of multiplexers provided in the non-display area; and a plurality of thin film transistors provided in the display area, wherein the plurality of multiplexers and the plurality of thin film transistors are arranged in a same layer; and each of the plurality of multiplexers comprises an input terminal and a plurality of output terminals, and the plurality of output terminals is respectively electrically connected to different touch connecting lines of the plurality of touch connecting lines.

12. The organic light-emitting display panel according to claim 1, wherein each of the at least one filling layer is at least partially made of an OCA adhesive.

13. The organic light-emitting display panel according to claim 1, further comprising:

an encapsulation layer arranged between the organic light-emitting layer and the microlens array layer and comprising a first inorganic layer, a first organic layer and a second inorganic layer that are sequentially stacked, the encapsulation layer extending from the display area to a part of the non-display area; and a barrier wall provided in the non-display area and surrounding the display area, wherein the first organic layer of the encapsulation layer extends from the display area to a region between the barrier wall and the display area.

14. The organic light-emitting display panel according to claim 13, wherein in the non-display area, the inorganic layer comprises a second through hole formed at a side of the barrier wall facing away from the display area; and the second inorganic layer extends from the display area to a region between the second through hole and the barrier wall, and the filling layer is provided in the second through hole.

15. The organic light-emitting display panel according to claim 14, wherein the at least one filling layer comprises a first filling layer and a second filling layer, a material of the first filling layer is same as the material of the microlens array layer, and a material of the second filling layer is same as the material of the refractive index matching layer; and the first filling layer is provided in the second through hole, and the second filling layer covers the first filling layer.

16. The organic light-emitting display panel according to claim 13, further comprising:
   a third filling structure provided in the non-display area and made of an organic material,
   wherein the inorganic layer comprises a second through hole formed at a side of the barrier wall facing away from the display area, and the second through hole is filled with the third filling structure, and at least one of the first inorganic layer and the second inorganic layer covers the third filling structure.

17. The organic light-emitting display panel according to claim 16, further comprising:
   a planarization layer provided in the display area and arranged between the organic light-emitting layer and the thin film transistor layer, wherein a material of the third filling structure and a material of the planarization layer are same.

18. The organic light-emitting display panel according to claim 1, further comprising:
   a color resist layer comprising a plurality of color resists and a black matrix,
   wherein the color resist layer is located at a side of the refractive index matching layer close to the light-exiting surface of the organic light-emitting display panel, and the black matrix extends from the display area to the non-display area.

19. The organic light-emitting display panel according to claim 18, wherein each of the plurality of color resists corresponds to one light-emitting pixel of the plurality of light-emitting pixels emitting light having a same color as the color resist, and an orthographic projection of the color resist onto the organic light-emitting layer covers the one light-emitting pixel; and an orthographic projection of the black matrix onto the organic light-emitting layer is located between two adjacent light-emitting pixels of the plurality of light-emitting pixels.

20. An organic light-emitting display apparatus, comprising an organic light-emitting display panel,
   wherein the organic light-emitting display panel has a display area and a non-display area surrounding the display area, and the organic light-emitting display panel comprises:
      a thin film transistor layer provided in the display area;
      an organic light-emitting layer provided in the display area and located at a side of the thin film transistor layer close to a light-exiting surface of the organic light-emitting display panel;
      a microlens array layer provided in the display area and located at a side of the organic light-emitting layer close to the light-exiting surface of the organic light-emitting display panel;
      a refractive index matching layer provided in the display area and located at a side of the microlens array layer close to the light-exiting surface of the organic light-emitting display panel; and
      at least one filling layer provided in the non-display area,
   wherein the organic light-emitting layer comprises a plurality of light-emitting pixels, the microlens array layer comprises a plurality of microlenses corresponding to the plurality of light-emitting pixels; the refractive index matching layer and the microlens array layer have different refractive indexes, each of the plurality of microlenses comprises a first surface that is in contact with the refractive index matching layer, and the first surface is a curved surface protruding towards one of the microlens array layer and the refractive index matching layer which has a smaller refractive index,
   the thin film transistor layer comprises a plurality of inorganic layers extending from the display area to the non-display area, and the at least one filling layer is arranged at a side of the plurality of inorganic layers close to the light-exiting surface of the organic light-emitting display panel, and
   a material of each of the at least one filling layer is same as at least one of a material of the microlens array layer and a material of the refractive index matching layer.

* * * * *